(12) United States Patent
Kotecha et al.

(10) Patent No.: US 6,958,545 B2
(45) Date of Patent: Oct. 25, 2005

(54) METHOD FOR REDUCING WIRING CONGESTION IN A VLSI CHIP DESIGN

(75) Inventors: Pooja M. Kotecha, Wappingers Falls, NY (US); Rama Gopal Gandham, Poughkeepsie, NY (US); Ruchir Puri, Peekskill, NY (US); Louise H. Trevillyan, Katonah, NY (US); Adam P. Matheny, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 10/755,590

(22) Filed: Jan. 12, 2004

(65) Prior Publication Data

US 2005/0151258 A1 Jul. 14, 2005

(51) Int. Cl.[7] .............................................. H01L 23/52
(52) U.S. Cl. ....................... 257/758; 257/758; 257/759
(58) Field of Search ................................ 257/758, 759; 716/8, 12, 14, 13, 9

(56) References Cited

U.S. PATENT DOCUMENTS 5,557,533 A * 9/1996 Koford et al. ................. 716/9
6,550,049 B1 * 4/2003 Torii ........................... 716/13

* cited by examiner

*Primary Examiner*—David Nelms
*Assistant Examiner*—Thinh T Nguyen
(74) *Attorney, Agent, or Firm*—H. Daniel Schnurmann

(57) ABSTRACT

A system and method for correcting wiring congestion in a placed and partially or fully globally-routed VLSI chip design while avoiding adding new timing or electrical violations or other design constraints. Globally-congested areas are identified along with determining terminated and non-terminated wires in the congested areas. The process includes optimizing the identified congestion areas, incrementally rerouting affected nets, testing the resultant design legality and congestion metrics, and committing or reversing the optimizations and reroutings. The optimizations further includes the movement of logic cells and decomposition, recomposition or any other modification of logic cell structures (possibly combined with cell movement) to move terminated wires to less congested grid edges, rearrangement of commutative connections within or between cells, or addition of buffers to cause reroutes of feedthrough wires.

11 Claims, 8 Drawing Sheets

METHOD FOR REDUCING WIRING CONGESTION IN A VLSI CHIP DESIGN

FIELD OF THE INVENTION

The present invention generally relates to very large scale integrated (VLSI) circuit design, and more particularly, to a system and method for restructuring logic to correct wiring congestion in a placed and partially or fully globally routed design to avoid adding new violations of other design constraints.

BACKGROUND OF THE INVENTION

In the production of standard-cell integrated-circuit chips, a designer first attempts to obtain a logical representation of the function the chip is to perform. The end result of the logic design is a netlist providing the necessary interconnections to boxes representing logic elements selected from a library. Upon completion of the logic design, a physical design must then be performed to translate the abstract logic design into its physical realization on the chip. The first step in the physical design process consists of placing boxes, wherein physical realizations of the library cells are used to place the boxes on a chip image. The placement must be legal, i.e., have no overlaps and must meet the technology constraints. After placement, some logic optimization is typically done, followed by the insertion of clocks. Thereafter, the design is routed, such that the netlist inter- connections between the boxes are realized as wire segments on the image.

The placement step endeavors to place the boxes while leaving enough room for routing the wires. In general, placement follows some model of how this routing is to be accomplished, but the model is not exact and does not always predict the actual routes. Placement is therefore unable to guarantee that the boxes will be placed in a manner such that all of the wires will be routed. In addition, some boxes may represent functions requiring a large number of inputs/outputs, which may preclude placing them in a way that encourages ratability, unless the design is very sparse. The reason why the chip cannot be routed is that the number of wires that are to be routed in a given area exceeds the space allocated for this purpose.

When all the wires cannot be routed, the chip will not perform the desired function and, thus, will not be manufacturable. A standard way of correcting unrouted wires is for the designer to use a physical editor to manually route or reroute the missing wires. This is a time consuming and expensive process, since in today's large chips it is not unusual to find thousands of wires that cannot be routed. In addition, in the event that an error is found in the logical design, this fix-up step may need to be repeated several times.

The method described herein attempts to avoid the problem of unwireable chips by performing logic restructuring of the design to encourage routability. In order to describe the inventive method, several definitions must first be provided.

Wiring congestion occurs when the number of wire passing through an area of the circuit design exceeds the space available for wiring. As previously mentioned, when wiring congestion occurs, the design cannot be manufactured. Thus, the congestion must be corrected. The current state-of-the-art is that the designer, using physical editing software tools, manually corrects these errors.

The present method makes use of the logic function of the circuit design referred to netlist (also referred to as network) that consists of a directed graph wherein the nodes represent boxes and the edges represent wires (alternately, nets). Each box carries with it the Boolean function it computes (e.g. AND, NOT, NOR, XOR, MUX, and the like) and a physical realization of that function in terms of transistors. These physical realizations have known attributes, such as size, aspect ratio and speed. Boxes also have pins which provide connecting points to the nets. For example, a box representing a two-input AND box has two input pins and one output pin. When the physical placement of the box occurs, the pins are implicitly placed since they are part of the physical realization of the box.

A subset of boxes within the network consisting of one box or a set of boxes interconnected by nets from the network is referred to as a sub-network of the network.

The way the boxes and nets are interconnected customizes the logic function that the chip is to compute. An output pin connected to a net is referred to as its source. The net may be connected to one or more input pins, all of which are referred to as sinks. The number of sinks of a given net is called the fan-out.

The present method applies to clocked circuits. Timing of the circuits provides a slack at each pin. The late mode slack (or simply slack) is the difference between the time at which a value must arrive at a pin and the actual time of arrival (the time when a stable signal value at the pin is reached). If the slack is negative (or less than a specified threshold), the signal arrives too late and the net or pin is called critical. If the slack is positive (or larger than a specified threshold), the net or pin is designated non-critical. If the slack at one pin is larger than the slack at another pin, the slack at the first pin is called less critical than the slack at the second pin. An early mode slack may be similarly defined as the difference between the earliest time that a signal can arrive at a pin (i.e., begin to change from its previous stable state) and the earliest time at which it is allowed to arrive.

Every circuit has a set of constraints it must meet. These constraints include timing constraints, which specify when clock and other signals actually arrive and when they are required to arrive, as described above. Additional constraints include electrical constraints, which limit the amount of capacitance on any net and the maximum amount of slew time that can be tolerated. Finally, there are other technology rules that constrain the design. For example, as mentioned above, placed boxes must not overlap. A design is considered to be legal if it meets all the design constraints.

It is the task of the placement to embed the physical realization of the boxes into the chip image in such a way that they obey technology constraints. For instance, the physical realizations of the boxes must not overlap. A placement consists of assigning to each box an (x,y) coordinate within the chip image, viewed as an array. It is a goal of placement to place the design so that wiring congestion is minimized. Placement programs use a variety of techniques to predict congestion. The most common is to simply minimize the total wire length in the design, since less wire usually means less congestion. In some cases, more elaborate methods of congestion prediction are used, but no known method guarantees that the outcome of the placement will always be routed without congestion.

It is the task of routing (alternately also referred to as wiring) to arrange the wires on the chip image so that connections among the pins match the logical connections. Chips typically have several metal layers upon which the wires are routed with the horizontal wires routed on different layers than the vertical wires. Then, a via is required to bring the net of one layer to another. The routing program must therefore produce a list of horizontal and vertical segments for each net, separated by vias, all of which conform to the technology requirements for wire spacing and wire capacity.

Routing is usually divided into two processes: a global wiring and a detailed wiring. In a global wiring, a grid system is overlayed on the chip image. Each square of the grid is referred to as a tile (also referred to as wiring tile) and the perimeter of the tile is formed by the four edges, i.e., on the north, south, east and west of the tile. Tiles are said to be adjacent when they share an edge. Boxes whose (x,y) coordinates are within the tile form part of the tile. Global routing routes the wires in the design from edge to edge according to logic requirements and technology rules, but it does not route from the edge of the grid to the pins of the boxes contained within the tile. It is, therefore, the task of detailed wiring to route from the tile edges to the pins and to assign metal layers and wiring positions.

FIG. 1 illustrates the aforementioned concepts. Shown therein is a conceptual representation of a chip as seen by the logic optimization, placement and routing. The chip origin is positioned at coordinate (xl,yl) and its upper right hand corner at (xh,yh). The area of the chip is overlaid with a wiring grid (dashed lines), the open squares are wiring tiles and the dashed lines are edges. The chip has two boxes, i.e., 'a', a two-input AND with one output placed at (xa,ya), and 'b', an inverter (NOT) with one input and one output at (xb,yb). The large black dots indicate pins. There is a net, 't', between box 'a' and box 'b'. The global route for net 't' is shown by the small cross-hatched rectangle (Note: the route stops at the edges of the wiring tiles, and does not go directly to the pins of boxes 'a' and 'b'). The complete detailed route for 't' is shown by a solid line.

The logic structure of the design may be changed according to the normal rules of Boolean algebra. This is called logic restructuring. Method of logic restructuring fall into four groups:

1. Logic decomposition takes a more complex function and breaks it down into component parts. This changes the structure of the logic, but not its function. By way of example, a single box may compute an AND-OR function (e.g., ab+cd). Then, the logic restructuring decomposes it into three boxes, an AND of 'a' and 'b' (ab), an AND of 'c' and 'd' (cd), and the OR of the output of the two AND boxes. Another example of a logic decomposition is taking a 6-way OR (a+b+c+d+e+f) and breaking it into a three-way OR (a+b+c) and OR'ing the output of the new box with the remaining terms from the original box (d, e and f), thereby creating a 3-way OR feeding a 4-way OR.
2. Logic recomposition is the opposite operation of logic decomposition. In the above examples, two ANDs (ab and cd) feeding an OR collapse into an AND-OR combination (ab+cd). The 3-way OR feeding a 4-way OR collapses into a 6-way OR. When performing a logic recomposition, it is important to handle multiple fan-outs properly.
3. Rewiring (also referred to as connection rearrangement or pin swapping) takes advantage of the ability to move the connection of nets to pins in the logic without changing the logic function. For instance, rewiring takes advantage of the commutative property of some logic functions (e.g., AND, NAND, NOR, OR, XOR, XNOR, and the like) by moving nets among the pins of commutative functions. In the previous OR example, a+b+c+d+e+f can be interchangeably written as f+b+c+d+e+a. Therefore, if net a is connected to pin 1 of the OR box, and net f to pin 6, then, the rewire causes net f to move to pin 1 and net a to pin 6. This rearrangement can be performed even if the logic has been decomposed, as described above. The pin rearrangement is not limited to commutative functions, since more advanced analysis can determine rearrangements beyond commutativity.
4. Repowering consists of three types of moves: resizing, buffering and cloning. In resizing, the box physical realization changes while keeping the Boolean function constant. In buffering, the fan-out of a net is reduced by adding buffers (single-input/single-output identity functions) or inverter pairs on a net. In cloning, the source box of the net is duplicated and the sinks of the net are distributed among the original box and its clone.

All of the above methods are used for reducing the congestion. In addition, once the design is placed, congestion is further reduced by moving a box from one wiring tile to another.

In most cases, wiring is performed after the chip placement. Thus, the wire end points are known and fixed. Routing (or wiring) programs attempt to completely route the wires among the end points to avoid congestion. Routing programs are divided in two phases: a global phase which routes wires to the edges of a grid positioned over the design, and a detailed wiring which completes the routes from the grid edges to the cell pins forming the design. The detailed router also assigns tracks and layers, as appropriate to the design style of the circuit. Given a global route, it is not always possible to achieve a detailed route because the routes cannot be completed from the grid edge to the pins. This is referred to pin congestion and will not be addressed by the present method, which relates only to congestion due to the global routes.

In some instances, wiring may be advantageously performed concurrently with placement, particularly since the placements in the design can to some extent avoid wiring congestion. While this alleviates certain congestion problems, the simultaneous placement and routing systems do not guarantee uncongested designs and provide no recourse when global congestion occurs.

Attempts have been made to restructure logic to improve wireability. In some cases, pre-routing (and, sometimes, pre-placement) metrics are used to restructure the design in areas where congestion is predicted by the metrics. These methods are not guaranteed to improve congestion. Since they work with estimates that often do not reflect the actual wire routes, they may optimize the wrong areas and, sometimes, increase wiring congestion. In other cases, a congested area is identified after routing and reimplemented in ways that improve wiring congestion. These methods are guaranteed to generate a different design, but not necessarily a more wirable one.

It is important to note that global congestion is often caused by a combination of terminated wires, where the wire enters a grid and terminates on the pin(s) of cell(s) within the grid, and feed-through wires, where the wire crosses adjacent wiring grids without making a connection to any logic circuits within the grid. A weakness of both of the above restructuring methods is that they improve wiring in the region selected, but have no affect on global wires because they do not take into consideration the effect of feedthrough wires. In these cases, the only solutions are: (a) to cause some terminated wires to be routed outside the selected region which, by definition, these methods cannot achieve, or (b) cause rerouting of the feedthrough wires by adding logic elements (e.g., buffers) to certain areas outside the congested region. Since these wires do not appear within the original region to be restructured, this kind of restructuring will not find solutions of the kind described in (a) and (b).

The aforementioned methods do not guarantee an improvement of the wireability of a design because global congestion is a function of placement, of the logic structure of the design and of the quality of the router. It is possible that a design placement and logic structure will preclude a successful routing, but this cannot be determined until the routing is actually completed. Estimates (e.g., rectilinear Steiner routes) do not provide sufficient detail and/or correlation with true routes to accurately predict congestion prior to the actual routing. Furthermore, none of the above restructuring methods address the problems of relieving wiring congestion in the presence of other design constraints. Even if the restructuring methods succeed in reducing congestion, it is achieved at the expense of adding timing, electrical, or power violations. Correcting these violations entails modifying the size or structure of the logic or adding new logic elements, all of which must be replaced and rerouted, often causing new congestion problems. Thus, it is not evident that the restructuring methods described above converge to a correct design.

In addition to the above restructuring methods, there are other known methods that address the problem of pin congestion in a detailed wiring. These include: swapping commutative pins on a single logic cell, and moving placed and routed logic by sliding cells into adjacent circuit rows or columns to allow more wiring room into the pins of the cells. Such methods are effective in improving the detailed wiring, but they do not address global congestion issues. Indeed, they are guaranteed not to affect global wiring.

OBJECTS AND SUMMARY OF THE INVENTION

Accordingly, it is an object of the present invention to provide a system and a method of alleviating wiring congestion using actual global routes that restructures logic in ways that are guaranteed to improve (and never degrade) congested wiring areas without degrading other design attributes (such as timing, capacitance, slew and power management).

It is another object of the present invention to correct wiring congestion in a placed and partially or fully globally-routed design in a way to avoid adding new violations of other design constraints.

These and other objects of the invention are achieved by a system and a method of reducing congestion in a chip wherein: a) global routing has been completed; b) transformations are interleaved with the global routing, i.e., by partially routing and reducing congestion, and repeating the process until the complete design has been routed; and c) by simultaneously applying the process to a design at the request of a global router in order to reduce wiring pressure on specific grid edges.

The optimizations include movement of logic cells and decomposition, recomposition or other modification of logic cell structures (possibly combined with cell movement) to move terminated wires to less congested grid edges, rearrangement of commutative connections within or between cells, or adding or moving the logic to cause reroutes of feedthrough wires.

The invention includes identifying globally congested areas, determining terminated and non-terminated wires in the congested areas, optimizing the wiring to improve congestion, incrementally rerouting affected nets, testing the resultant design legality and congestion metrics, and committing or reversing the optimizations and reroutings.

Optimizations further include the movement of logic cells and decomposition, the recomposition or other modification of the logic cell structures (possibly combined with cell movement) to move terminated wires to less congested grid edges, the rearrangement of commutative connections within or between cells, or adding or moving logic to cause reroutes of feedthrough wires.

BRIEF DESCRIPTION OF THE DRAWINGS

The foregoing and other objects, aspects and advantages of the invention will be better understood from the following detailed description of a preferred embodiment of the invention with reference to the drawings, in which.

DETAILED DESCRIPTION OF A PREFERRED EMBODIMENT OF THE INVENTION

The novelty of the invention being described herein resides in applying transformations that move, decompose, add logic elements or modify wire connections in order to reduce congestion and provide a routable design. Hereinafter, an algorithm is provided along with incremental placement and incremental routing to relieve the wiring congestion. Success at this process reduces or eliminates the need for manual intervention on the part of the designer.

The method assumes that the design is already placed, optimized and globally routed. Global routing places a wiring grid over the design, as described above. Each edge of the grid has a known capacity which is the amount of wire $C_i$ that can pass over edge I, and a utilization $U_i$, (i.e., how many wires cross the edge i, weighted by width), such that $$U_i = \text{Sum}_{\text{wire } j \text{ crossing edge } i} \text{width}_j, \quad \text{(Eq. 1)}$$

wherein $\text{width}_j$ is the width of wire j crossing edge i. (In the present example, for clarity sake, all the wires are assumed to have a width of 1). If $$U_i > C_i, \quad \text{(Eq. 2)}$$

the desired wires will not fit on the edge because of over usage. Such an edge is said to be congested and the design is not wireable.

A congestion metric $D_i$ for the edge i is defined as $$D_i = U_i - C_i$$

If $D_i>0$, edge i is deemed to be congested. If $D_i>D_j$, then edge i is found to be more congested than edge j. In practice, it is desirable not to fill completely the wiring tracks. Accordingly, a predefined threshold $T_i$ is used, typically, a percentage of $C_i$. If $D_i>T_i$, then the edge is considered in need of relief. For purposes of the present invention, two properties will be considered:

Property 1

Figure 2B:
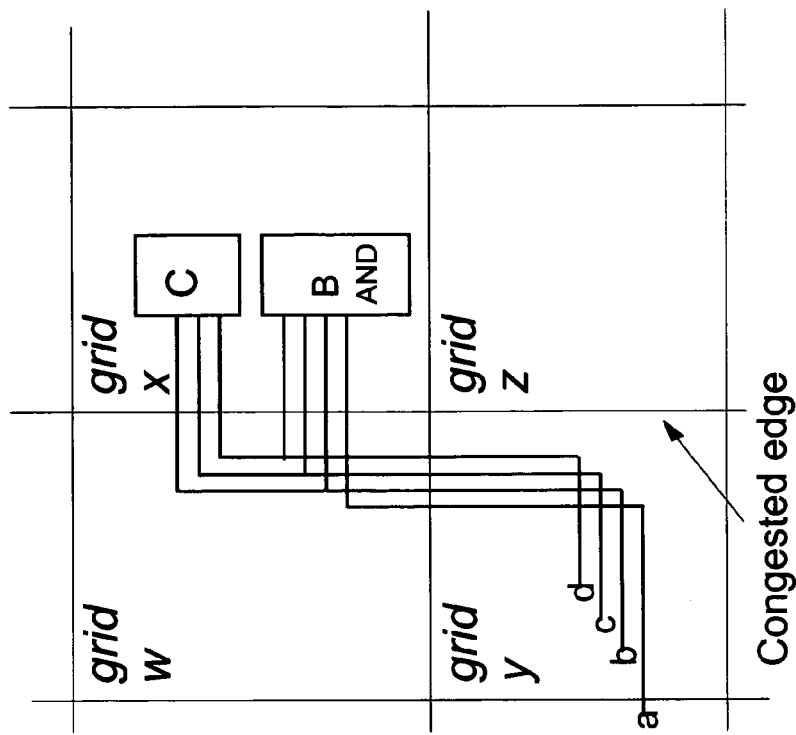
FIGS. 2a–2b are examples of a logic movement optimization that reduces wiring congestion, according to the present invention.
Figure 2A:
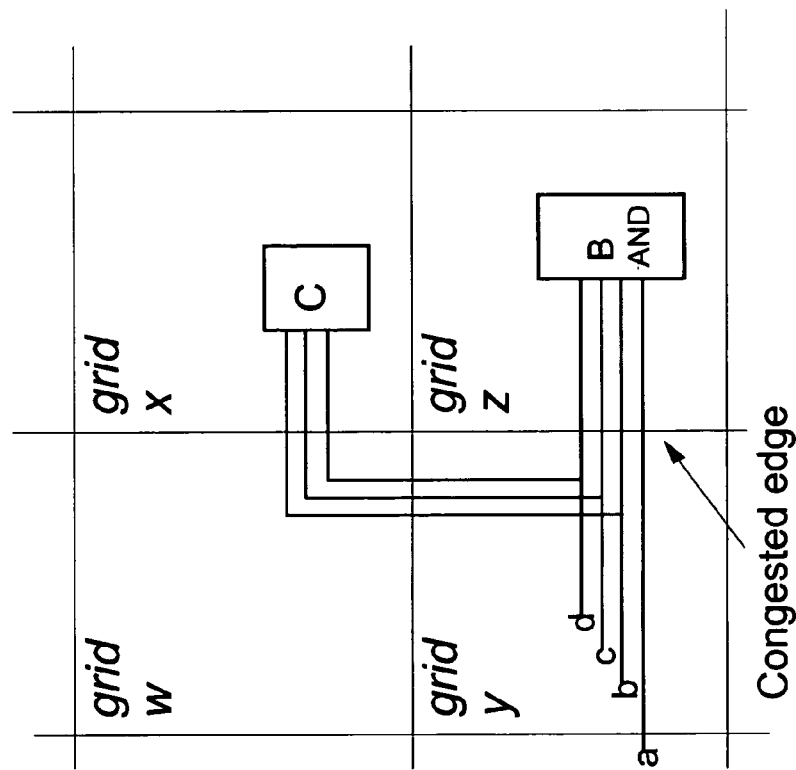

Wires crossing an edge of the grid and which are connected to one or more boxes within the grid but which do not cross any other edge of the grid (e.g., in FIG. 2a, wire 'a' in grid z is an example of such a wire). These wires are referred to as terminated wires.

Property 2

Figure 1:
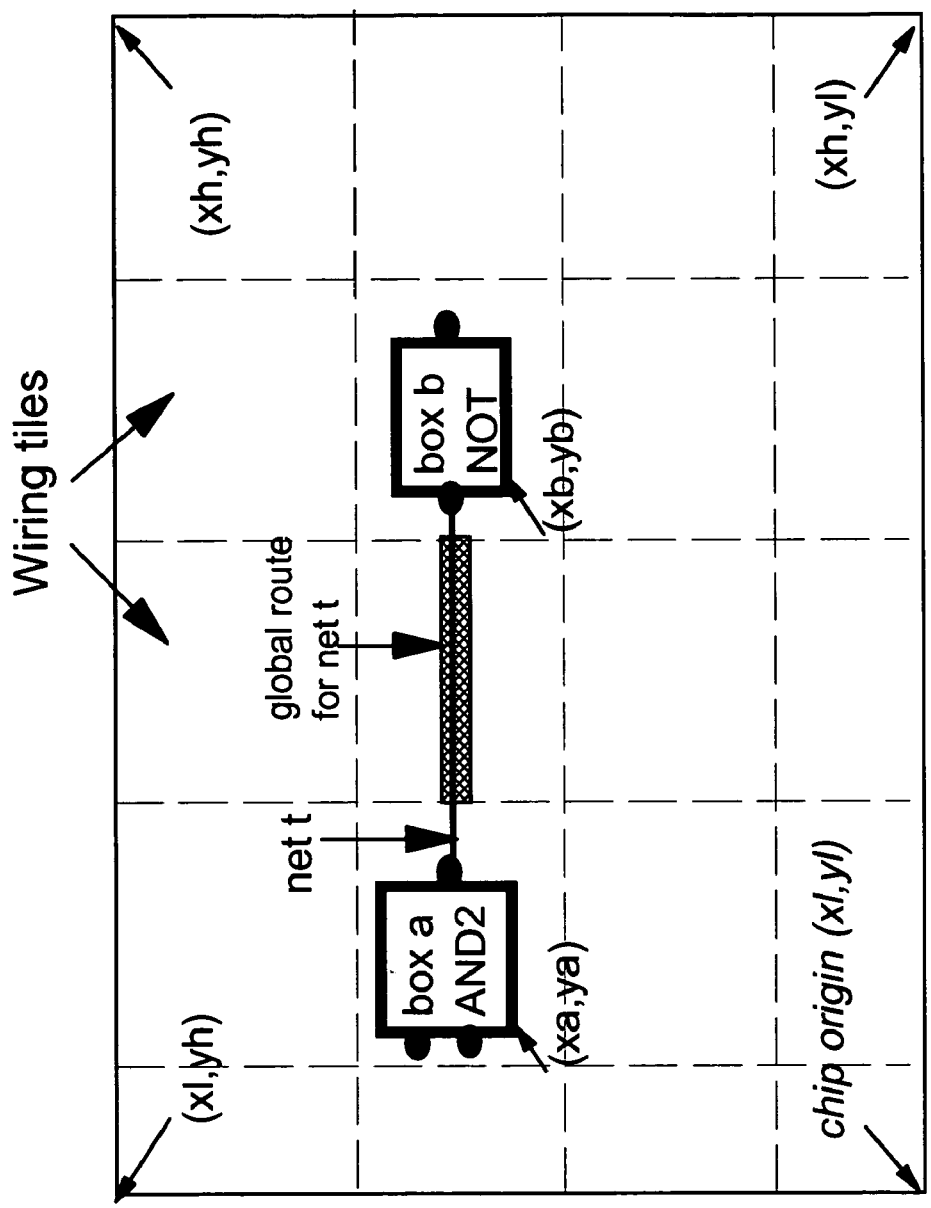
FIG. 1 illustrates several conventional definitions referred to in the present invention.

Wires that are routed through one edge in the grid and exit at another, preferably not connected to any box within the grid are referred to feedthrough wires. (e.g., in FIG. 1, wire 'a' in grid y is an example of such a wire).

The method of correcting congestion proceeds through the edges of the wiring grid ordered in decreasing order of $D_i$. If $D_i<T_i$ for all i's, no congested edges are present, and the process terminates. Assuming that edge i is found to be congested. Then, the method examines the grids to the left and to the right of the congested edge or, alternatively, above and below.

Referring now to FIG. 2a, assuming that the edge between grid y and grid z is congested, the method examines grids y and z, and all their surrounding grids.

Hereinafter, five examples of structural changes are shown to improve wirability: Sample Optimization Techniques 1 (OPT1), 2 (OPT2), 3 (OPT3), 4 (OPT4), and 5 (OPT5). OPT1 moves a box with terminated wires from one grid to another. This correction is shown by moving box B entirely from grid z (FIG. 2a) to grid x (FIG. 2b). In the present case, crossing the congested edge is reduced by 4, while crossing the edge into grids w and x increases by 1 (due to wire 'a').

OPT2 decomposes the box in a Boolean fashion, with some of the terminated wires moving from the congested grid.

Figure 3B:
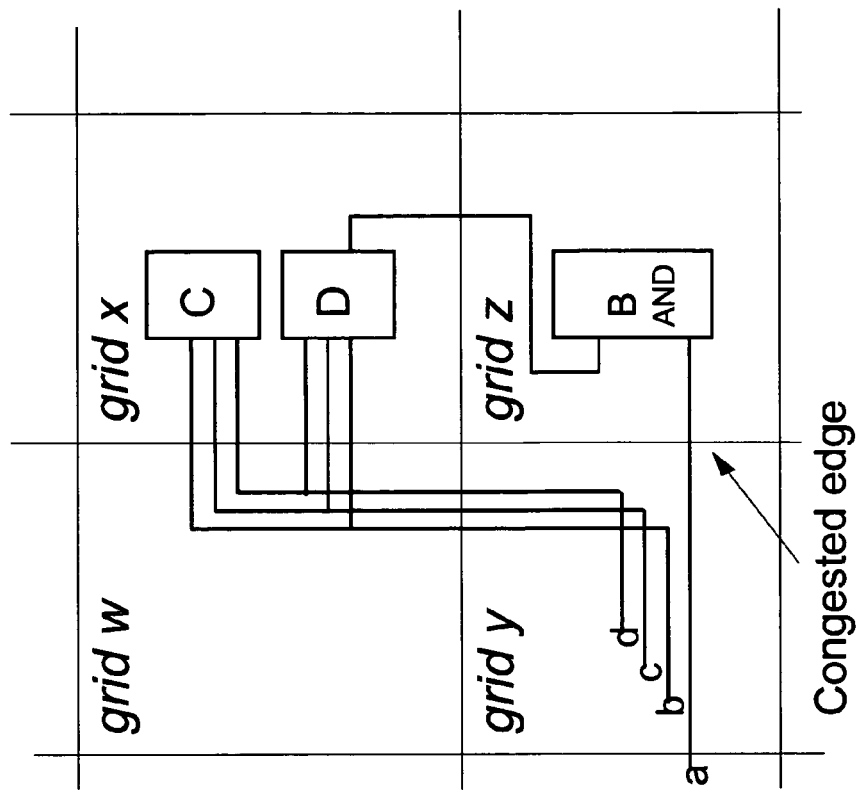
FIGS. 3a–3b are examples of a logic decomposition optimization that reduces wiring congestion.

FIG. 3b illustrates the previously mentioned correction, with a box being split into a two-way AND remaining in grid z, and a three-way AND box D which moves to grid x from grid z. Still referring to FIG. 3b, since wires b, c and d were already incident to grid x, the congestion does not increase along that edge. On the other hand, the crossings increase by 1 across the edge from grid x to z, and decrease by 3 on the congested edge under consideration. This optimization is executed on any box that performs an easily decomposable non-sequential Boolean function, such as NAND, NOR, AND, OR, XOR and XNOR. Decompositions also apply to more complex functions such as AO, AOI, OA, OAI and MUX, but these decompositions are more constrained than those applicable to simpler Boolean functions.

Figure 4A:
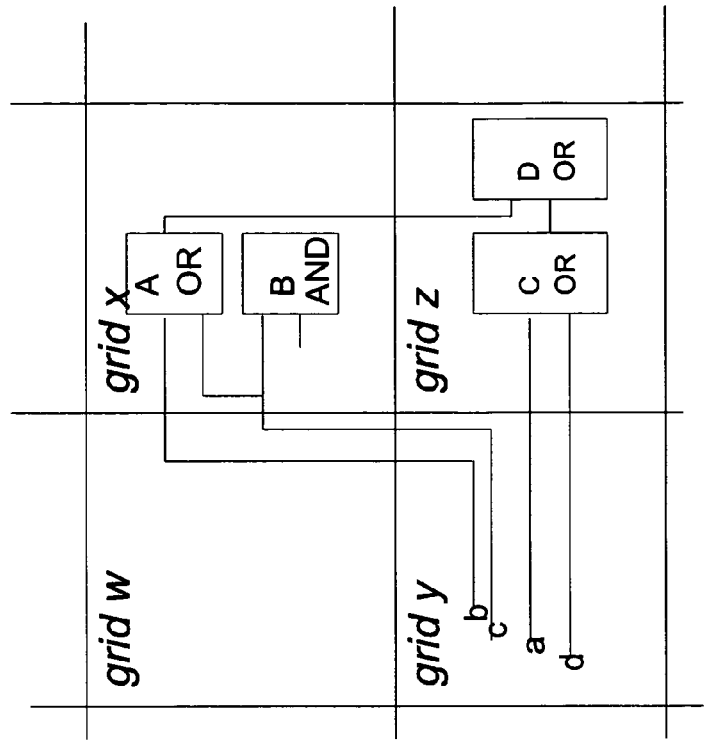
FIGS. 4a–4b are examples of a connection rearrangement optimization that reduces wiring congestion.
Figure 4B:
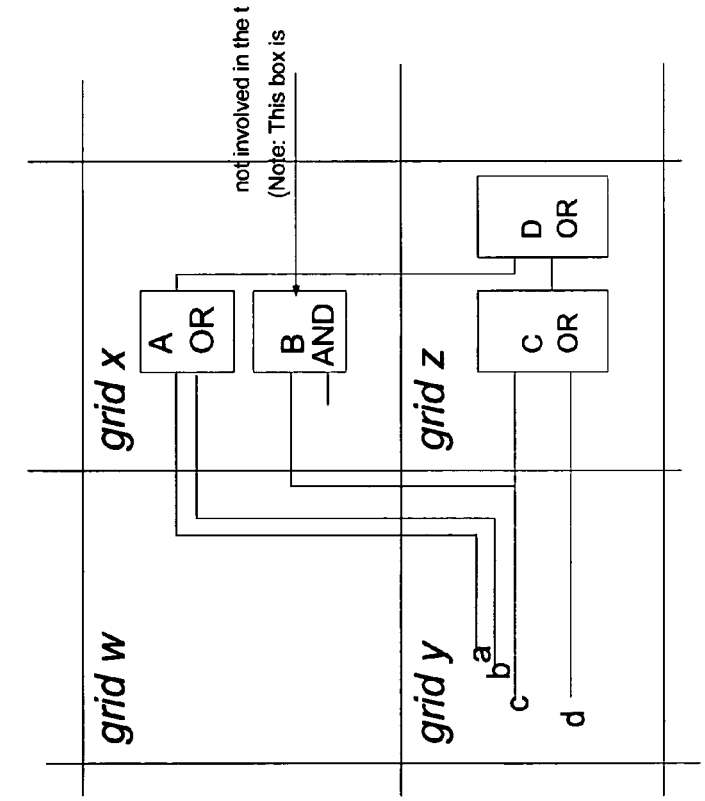
Figure 5B:
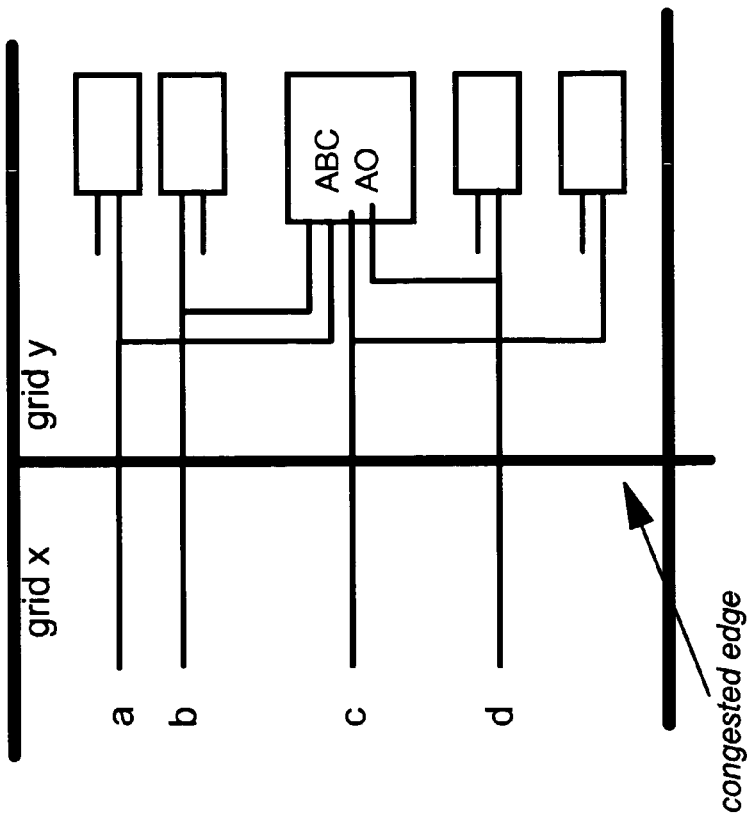
FIGS. 5a–5b are examples of a logic recomposition optimization that reduces wiring congestion.
Figure 5A:
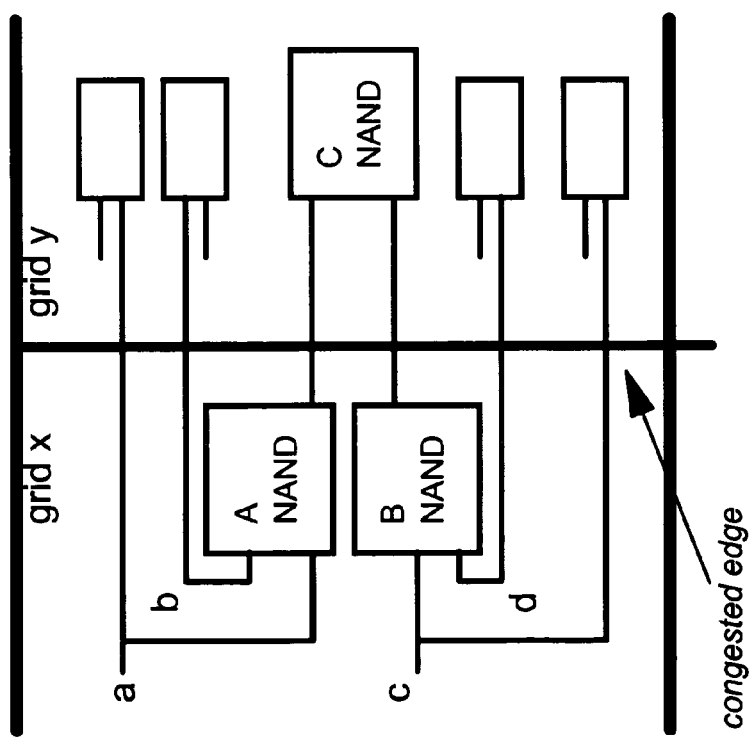

Optimization Technique 3 (OPT3) does not move boxes, but rather rearranges connections to improve wireability, as illustrated in FIG. 4. It takes advantage of the fact that connections in commutative fan-in trees are functionally equivalent. For instance, the function (a+b)+(c+d) may be rewritten as (a+c)+(b+d) without changing the function of the circuit. FIGS. 4 and 5 show how this rearrangement reduces congestion. The configuration depicted in FIG. 4a has a total of eight grid crossings, while FIG. 4b, which performs the same function, has only six.

OPT4 takes advantage of logic recomposition. FIG. 5 shows how reconstituting an AO box from three NANDs reduces the wiring congestion over a grid edge.

Figure 6B:
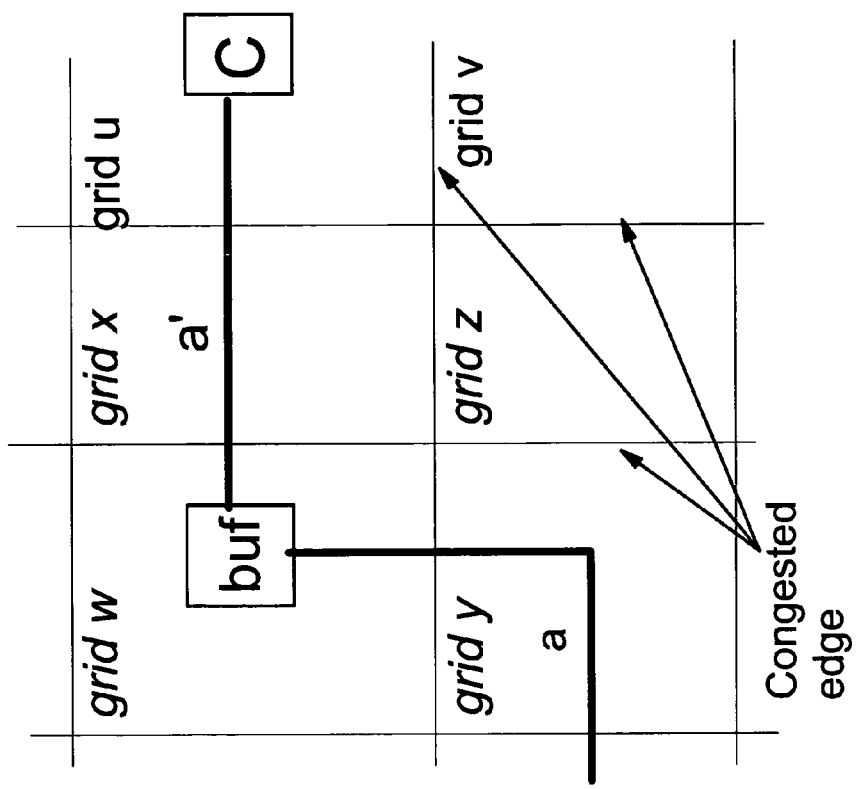
FIGS. 6a–6b are examples of an optimization process to improve congestion caused by feedthrough and terminated wires.
Figure 6A:
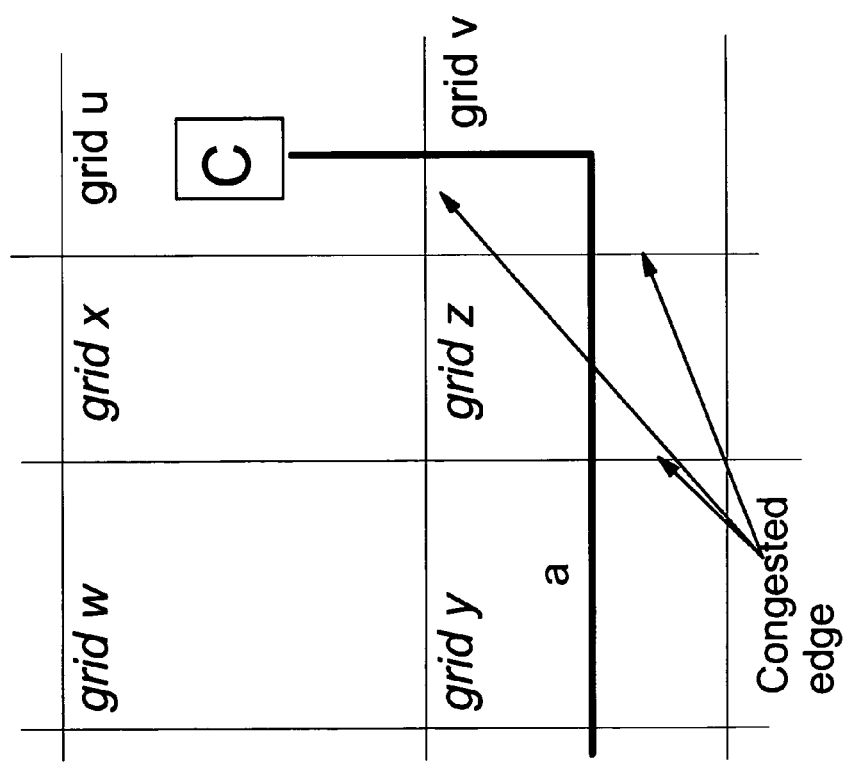

OPT5 provides a method of reducing congestion by way of adding buffers. It is effective on both terminated and feedthrough nets. Buffers are placed in a way to force routing of feedthrough and terminated nets to avoid congested edges. FIG. 6a shows net a, which is a feedthrough net through y, z and v, and terminating in u. The edges between y and z, z and v, and v and u are congested. By adding buffer 'buf' in w, the routing is forced along decongested edges between y and w; w and x; and x and u. Net a', which is functionally equivalent to a, is added during this process.

The conditions under which the optimizations can be achieved on congested edge i are:

1. Following optimization, $D_i'<D_i$, where $D_i'$ is the new congestion metric on edge i.
2. Following optimization, $D_j' \leq D_j$, where the $D_j'$ are the new congestion metrics for edges $\{j|D_j \leq D_i\}$
3. There is room to place the new (or moved) box within the grid (applicable to OPT1 and OPT2).
4. The optimization does not cause the design to violate timing or electrical constraints, e.g., for each pin k of all boxes involved in the transformation, $Slack_{k'} \geq \min(Slack_k, Slack_{threshold})$, where $Slack_k$ and $Slack_{k'}$ are the slack of pin k before and after the transformtaion, respectively, and $Slack_{threshold}$ is a user-specified value.

Note that the aforementioned methods depend on incremental global rerouting to assess the grid crossings after optimization has been considered, as well as incremental analysis of timing and electrical characteristics of the design to identify potential constraint violations caused by the transformationm under consideration.

OPT3 is the least expensive of the optimizations in terms of cost, since it does not require any new placements. In terms of cost, OPT1 follows, because while it involves replacing the new box, it may not require additional space. OPT2 requires both a new placement and a new box. However, in cases where one of the box inputs has multiple terminations in the original wiring tile, OPT2 saves the crossings in selected instances where OPT1 fails to do so. Moving a box containing a net with multiple terminations may not necessarily reduce the congestion because the net still must go to the remaining boxes. However, decomposing the logic overcomes this problem by leaving the boxes having nets with multiple terminations in the original wiring tile.

Figure 3A:
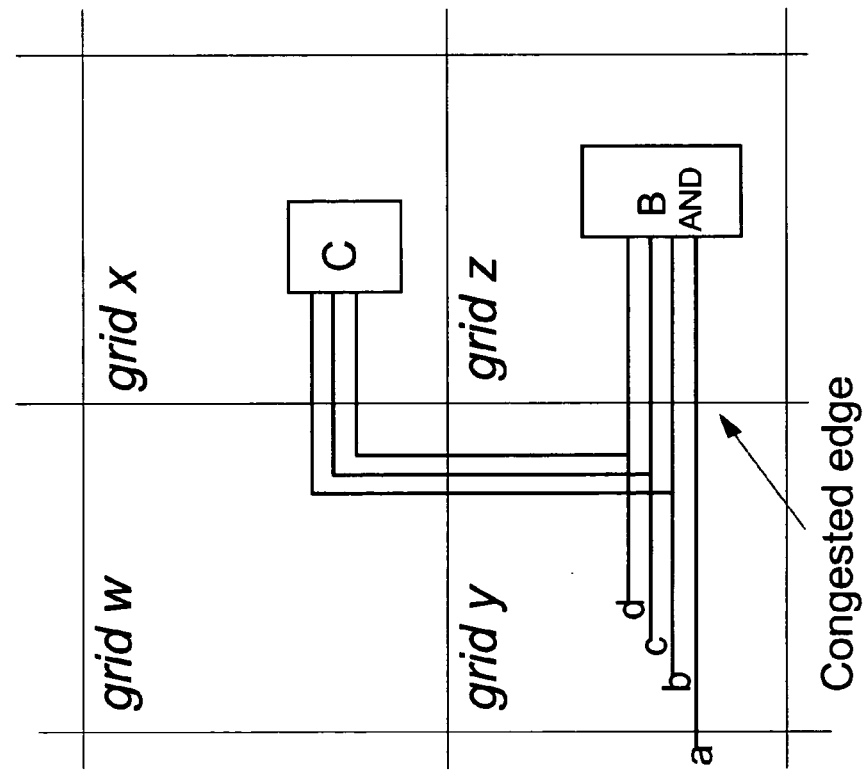

The decision regarding the destination of a move utilizing OPT1 or the placement achieved by OPT2 is based on an heuristic approach predicated on sharing wire segments already routed and placement availability. By way of example, in FIGS. 2 and 3, grid w was selected because wires b, c and d were already crossing the western boundary. (Note that, although the figures illustrate operations on adjoining wiring grids, this was done solely with the intent of compacting the drawings, and was not intended to be a limitation of the inventive method).

An additional heuristic provides having the wires that are to be moved to be handled beginning with those causing the least timing impact compared to those causing the highest timing impact. Relocating a non-critical wire is less likely to cause a timing problem after optimization than relocating a critical wire.

Thus far, the inventive method has been described with respect to terminated wires. However, the invention is not limited to only optimizing terminated wires. It is possible to perform similar optimizations on feedthrough wires. However, the analysis is more complex as are the heuristics applicable to 'good grid destinations' of a moved or newlycreated box. OPT 5(FIG. 6) shows how by adding buffers, one helps reducing congestion over a wiring edge caused by feedthrough wires.

Figure 7:
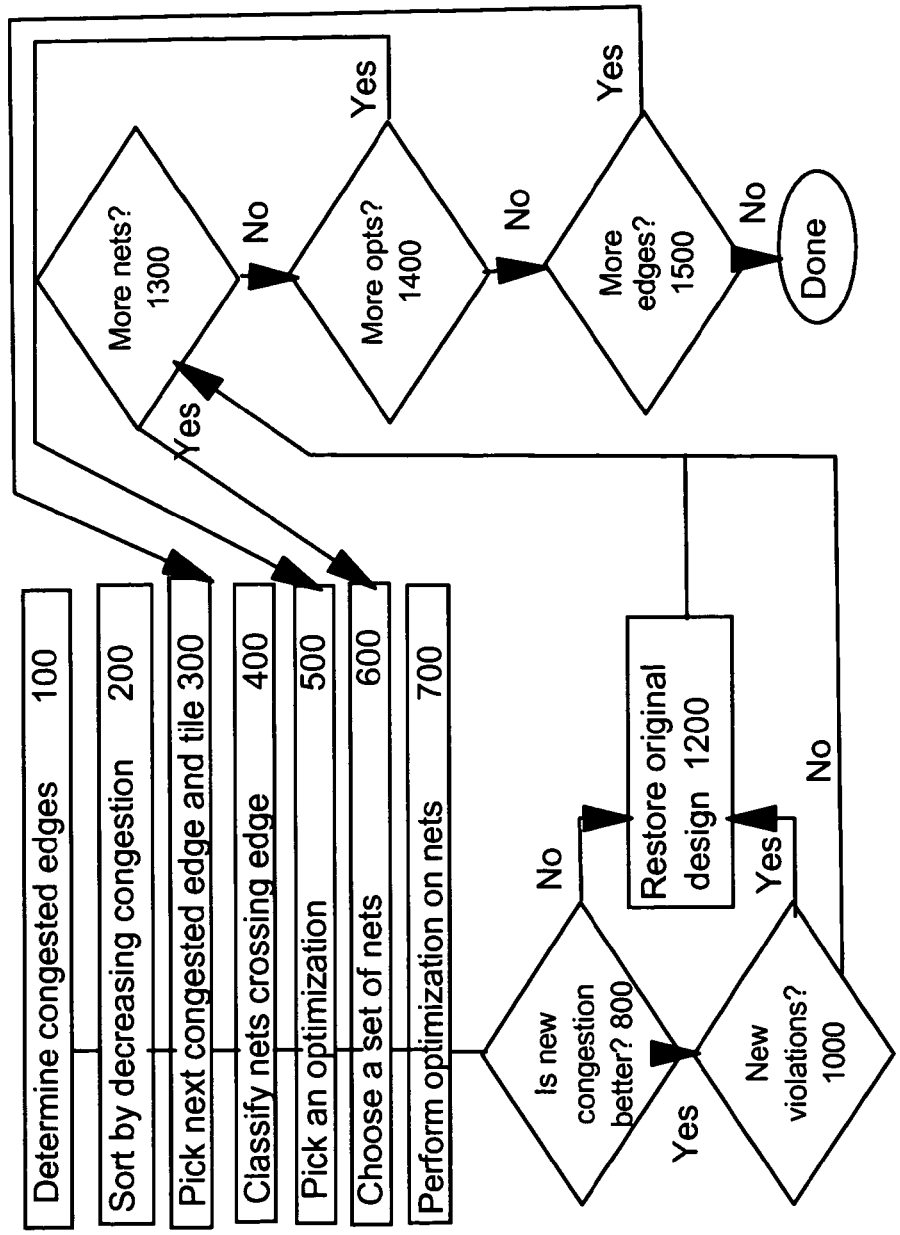
FIG. 7 shows a flowchart illustrating the preferred embodiment of the invention.

FIG. 7 shows a flowchart of the preferred embodiment of the invention, wherein a series of optimizations are applied to congested edges of the design.

The process begins at step 100 wherein a set of congested edges are selected by determining the ratio of the edge usage to the edge capacity. If the ratio is greater than a predetermined user specified percentage, the edge is incorporated in the list of congested edges.

In step 200, the congested edges list is sorted by decreasing order of congestion, with the most congested edges topping the list.

In step 300, the first unprocessed edge on the list is selected. For the first iteration, it corresponds to the first (i.e., the most congested) edge on the list. The grid (also referred to tile or wiring tile) adjacent to the edge in any direction is selected for processing.

In step 400, each net crossing the edge is classified as terminated or feedthrough by examining the sinks of the net within the tile.

In step 500, an optimization is selected from the available restructuring optimizations.

In step 600, a set of nets to be optimized is chosen.

In step 700, the optimization is performed on the set of nets, causing rerouting of the nets within the set.

In step 800, the congestion results are re-evaluated by comparing previous a congestion to post-optimized congestion. If these results show an improvement, branching to step 1000 takes place; otherwise the process continues with step 1200.

In step 1000, other design constraints (e.g., timing or electrical violations) are evaluated. If violations exist, the process proceeds with step 1200; otherwise the program branches to step 1300.

In step 1200, the design is restored to its pre-optimization condition since congestion was not improved or no violation (electrical and/or timing) was introduced. This step guarantees that the congestion will never be made worse by these optimizations.

In step 1300, a determination is made to see whether there are more nets to optimize. If not, the process continues with step 1400. Otherwise, return to step 700.

In step 1400, a check is made to see if more optimizations need to be performed. If not, proceed to step 1500; else, return to step 500.

In step 1500, a check is made to ascertain whether more congested edges remain to be process. If not, the process is terminated; otherwise, it proceeds with step 300.

Figure 8:
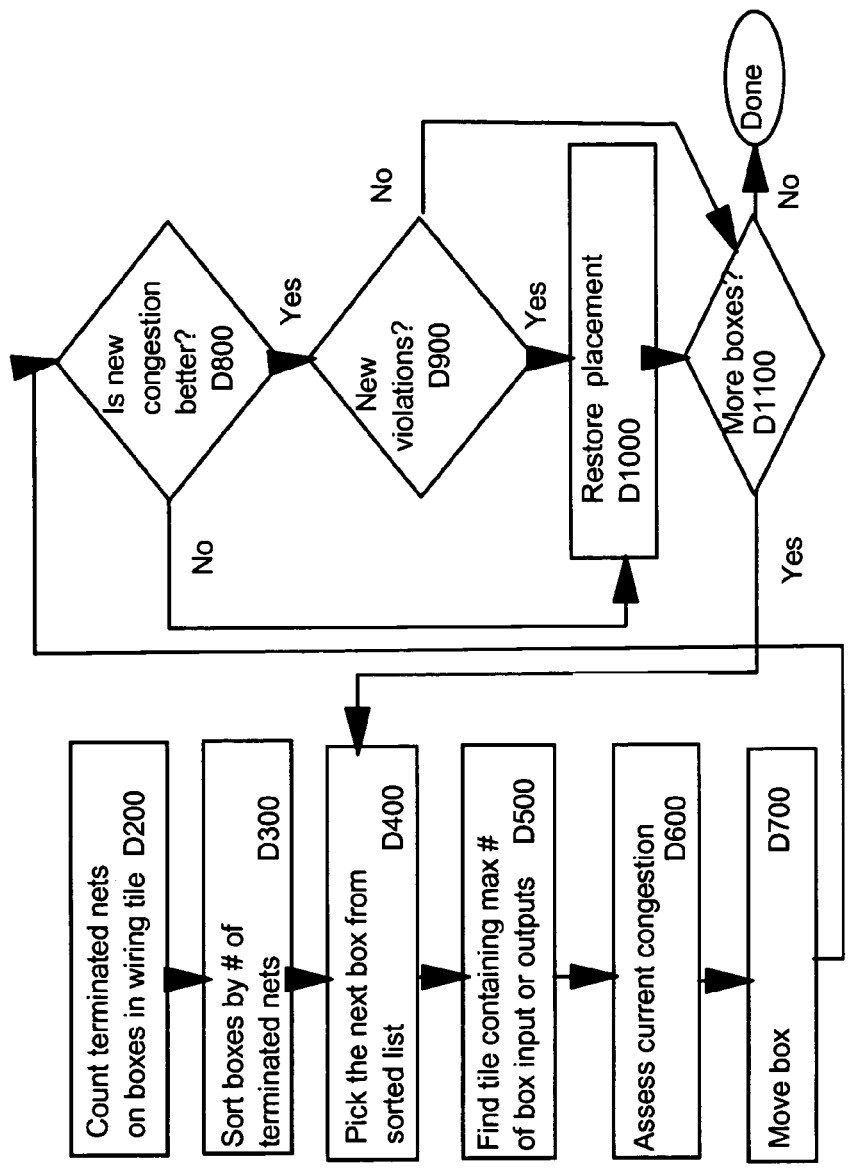
FIG. 8 is a flowchart illustrating the optimization process by performing box movements to reduce wiring congestion.

FIG. 8 shows a preferred embodiment of a sample optimization, and more specifically, of OPT1. The present case of optimization corresponds to the one shown in FIG. 2. The optimization receives a wiring edge, a wiring tile and a set of nets from step 600.

In step D200, each box within the wiring tile is scored based on how many inputs are terminated nets.

In step D300, the list of boxes is sorted in descending order of the terminated-net count.

In step D400, the next unprocessed box from the sorted list is selected. In the first iteration, a first box is chosen.

In step D500, a wiring tile different from the current wiring tile under consideration is selected, that shares the maximum number of terminated nets with the selected box.

In step D600, the wiring congestion of the current configuration is evaluated.

In step D700, the selected box is moved to the maximal wiring tile found in step 500.

In step D800, the wiring congestion of the new configuration is assessed. If no improvement is shown, the process branches to step D1000; otherwise, it returns to step 900.

In step D900, other design constraints (e.g. timing, electrical, placement) are considered. If there are constraint violations, it proceeds with step D1000; otherwise, it branches to step D1100.

In step D1000, either the congestion did not improve or a violation was encountered, in which case, the process restores the placement of the box back to its original location. (This step guarantees that wiring congestion will not degrade).

In step D1100, if more boxes on the list still exist, the process proceeds with step D400 to pick the next unprocessed one; otherwise, the optimization terminates.

Whereas the present invention has been described in terms of a preferred embodiment, it will become apparent to those skilled in the art that changes and modifications may be made thereto without departing from the spirit and the scope of the invention, all of which fall within the scope of the appended claims.

What is claimed is:

1. A method of reducing wiring congestion in a placed and globally routed integrated circuit design comprising the steps of
   a) subdividing said integrated circuit design into a plurality of wiring tiles, each wiring tile separated from another by a wiring edge;
   b) determining a congestion across each of said wiring edges of said integrated circuit design;
   c) performing a local transformation on at least one of said wiring edges to reduce said congestion across said wiring edge;
   d) determining whether said congestion across said wiring edge has improved and whether said local transformation has caused new congestion problems or violations of design constraints; and
   e) accepting said local transformation only if no new congestion problems have been caused and no design constraint is determined to have been violated.

2. The method as recited in claim 1, wherein said local transformation comprises incrementally rerouting portions of said design wherein said local transformation was performed.

3. The method as recited in claim 1, wherein said transformation comprises modifying said placement of at least one box of said integrated circuit design.

4. The method as recited in claim 1, wherein said transformation comprises modifying said connectivity of said at least one box of said integrated circuit design.

5. The method as recited in claim 1, wherein said transformation comprises decomposing said at least one box of said integrated circuit design.

6. The method as recited in claim 1, wherein said transformation comprises replacing at least one sub-network of said integrated circuit design with an alternative equivalent sub-network.

7. The method as recited in claim 1, wherein said transformation adds logic elements to said integrated circuit design to force rerouting of wires through said uncongested edges.

8. A method of reducing wiring congestion in a placed and globally routed integrated circuit design comprising the steps of a) subdividing said integrated circuit design into a plurality of wiring tiles, each wiring tile separated from another by a wiring edge;
b) identifying all of said wiring tiles to determine congested areas across the wiring edges of each of said wiring tiles;
c) iteratively determining a congestion across each of said wiring edges of said integrated circuit design;
d) successively performing a local transformation on at least one of said wiring edges to reduce said estimated congestion across said wiring edge;
e) incrementally rerouting portions of said design wherein said local transformation was applied;
f) determining that the incremental reroute has caused no new congestion problems and whether the congestion across said wiring edge has improved;
g) determining whether any design constraint is violated by said local transformation; and
h) accepting said local transformation only if no design constraint is determined to have been violated.

9. A method of reducing wiring congestion in a placed netlist of an integrated circuit chip comprising the steps of:
a) executing a global routing of said placed netlist, said global routing including the step of subdividing said netlist into a plurality of wiring tiles, each wiring tile separated from another by a wiring edge;
b) during the execution of step a), simultaneously determining congestion across each of said wiring edges of said integrated circuit design;
c) performing a local transformation on at least one of said wiring edges to reduce said estimated congestion across said wiring edge;
d) determining whether said congestion across said wiring edge has improved and whether said local transportation has caused new congestion problems or violations of design constraints; and
e) accepting said local transformation only if no new congestion problems have been caused and no design constraint is determined to have been violated.

10. A method of reducing wiring congestion in a placed netlist of an integrated circuit chip comprising the steps of:
a) executing a partial global routing of said placed netlist, said global routing including the step of subdividing said netlist into a plurality of wiring tiles, each wiring tile separated from another by a wiring edge;
b) after the execution of step a), determining of congestion across each of said wiring edges of said integrated circuit design;
c) performing a local transformation on at least one of said wiring edges to reduce said estimated congestion across said wiring edge;
d) incrementally rerouting portions of said design wherein said local transformation was performed;
e) determining whether said congestion across said wiring edge has improved and whether the incremental reroute has caused no new congestion problems;
f) accepting said local transformation only if no new congestion problems have been caused and no design constraint is determined to have been violated; and
g) repeating steps a) through f) until all the nets have been routed.

11. A program storage device readable by machine, tangibly embodying a program of instructions executable by the machine to perform method steps for of reducing wiring congestion in a placed and globally routed integrated circuit design, said method steps comprising:
a) subdividing said integrated circuit design into a plurality of wiring tiles, each wiring tile separated from another by a wiring edge;
b) determining a congestion across each of said wiring edges of said integrated circuit design;
c) performing a local transformation on at least one of said wiring edges to reduce said congestion across said wiring edge;
d) determining whether said congestion across said wiring edge has improved and whether the local transformation has caused new congestion problems or violations of design constraints; and
e) accepting said local transformation only if no new congestion problems have been caused and no design constraint is determined to have been violated.

* * * * *